United States Patent [19]

Furutani et al.

[11] Patent Number: 4,817,056
[45] Date of Patent: Mar. 28, 1989

[54] SEMICONDUCTOR MEMORY DEVICE

[75] Inventors: Kiyohiro Furutani; Koichiro Mashiko; Kazutami Arimoto; Noriaki Matsumoto; Yoshio Matsuda, all of Itami, Japan

[73] Assignee: Mitsubishi Denki Kabushiki Kaisha, Tokyo, Japan

[21] Appl. No.: 77,622

[22] Filed: Jul. 24, 1987

[30] Foreign Application Priority Data

Jul. 30, 1986 [JP] Japan ................................ 61-179739

[51] Int. Cl.$^4$ ................................................ G11C 7/00
[52] U.S. Cl. ...................................... 365/200; 365/203
[58] Field of Search ........................ 365/200, 230, 203; 371/10, 21

[56] References Cited

U.S. PATENT DOCUMENTS

| | | | |
|---|---|---|---|
| 4,365,319 | 12/1982 | Takemae ............................ | 365/200 |
| 4,392,211 | 7/1983 | Nakano et al. ...................... | 365/200 |
| 4,428,068 | 1/1984 | Baba ................................... | 365/200 |
| 4,656,610 | 4/1987 | Yoshida et al. ..................... | 365/200 |

FOREIGN PATENT DOCUMENTS 61-8520  3/1986  Japan .

OTHER PUBLICATIONS

"A Fault-Tolerant 64K Dynamic RAM", R. P. Cenker et al., *ISSCC 79, Digest of Technical Papers*, pp. 150-151, Feb. 1979.

"Equipping a Line of Memories with Spare Cells", Abbott et al., *Electronics*, Jul. 28, 1981, pp. 127-130.

*Primary Examiner*—Joseph A. Popek
*Attorney, Agent, or Firm*—Saidman, Sterne, Kessler & Goldstein

[57] ABSTRACT

In a semiconductor memory device of a redundancy configuration having lines (rows or columns) of main memory cells and a line of spare memory cells made to substitute a defective line responsive to the address of the defective line, a comparator compares an address input to the memory device, with the address of the defective line which has been programmed in it, and a spare line selector selects the spare line when the input address is found to coincide with the programmed address. The comparator comprises a dynamic NOR gate having discharge paths each formed of a gate element receiving a bit or its inversion of the input address to be opened or closed depending on the value of the particular bit of the input address currently applied, and a PROM element in series with the gate element. The dynamic NOR gate has a first node forming an output thereof and a second node, each of the series connections of the PROM element and the gate element is connected across the first and the second nodes. The potential on the second node is caused to be identical with the potential on the first node during the precharge period.

14 Claims, 3 Drawing Sheets

SEMICONDUCTOR MEMORY DEVICE

BACKGROUND OF THE INVENTION

The present invention relates to a semiconductor memory device of a redundancy configuration enabling substitution for defective bits or memory cells, and particularly to an improvement for reducing an access time in a static column mode.

FIG. 1 shows a conventional semiconductor memory with a redundancy configuration for correcting defect, as disclosed in Japanese Patent Application Publication No. 8520/1986. As illustrated, it comprises a row of sense amplifiers 1, an array 2 of spare memory cells 2', an array 3 of normal memory cells which may include a defective memory cell 3'. The memory device further comprises a word line drive circuit 4, a row decoder 6, a comparator 6 having signal path interrupter element 6' which may be in the form of a fuse blown or unblown by laser beam or the like depending on the corresponding bit of the address of a defective memory cell. More specifically, a set of signal path interrupter elements 6' are broken (blown) or unbroken (unblown) so that the code as represented by the set correspond to the address of the detective row for which the spare row is substituted. The signal path interrupter element 6' will be called a PROM element. The memory device further comprises a row decoder inhibiting circuit 7, a control signal generator circuit 8, a word line clock generator 9, a dummy decoder 10 for adjusting (by introducing delay) the timing of activation of word line clock generator 9, a multiplexer 11, a column decoder 12 and a data input/output butter circuit 13. The memory device further comprises data input/output lines 14, bit lines 15, spare word lines 16 and word lines 17. $\phi_p$ represents a precharge clock and $\phi red$ is a signal which is at "L" level (low voltawe level) only when redundancy correction of the defective bit is made.

The memory reading operation with a defective bit being corrected will be described. It is assumed that a defective memory cell 3' is replaced by a spare memory cell 2' on the same bit line 15 to which the defective memory cell 3' is also connected.

When an address buffer output signal (hereinafter abbreviated as "address signal") is input to the row decoder 5 and the comparator 6. The comparator 6 compares the input address with the address programmed by the PROM elements 6', and when finding coincidence, produces an output for activating the control signal generator circuit 8.

The control signal generator circuit 8 activates the row decoder inhibiting circuit 7 and the dummy decoder 10. The output of the dummy decoder 10 is established at the timing when the row decoder 5 stops its function upon operation of the row decoder inhibiting circuit 7. The output of the dummy decoder 10 activates the word line clock generator 9, whereupon the word line drive clock thereby generated activates the word line drive circuit 4. By then, The row decoder 5 has been inactivated by the row decoder inhibiting circuit 7 so that the word line drive circuit 4 connected to the row decoder 5 maintains low the word line 17 that is connected to the word line drive circuit 4.

The spare word line 16 is made high (high voltage level) by the word line drive circuit 4, and minute signal voltages corresponding to the respective cell data of one row of the spare memory cell array 2 connected to the spare word line 16 appear on all the bit lines. Thereafter the row of sense amplifiers 1 are activated to amplify the minute signals, which are then transmitted to the multiplexer 11. The multiplexer 11 selects the cell data of the spare memory cell 2' connected to the bit line 15 in accordance with the select signal of the column decoder 12, and the selected cell data is supplied through the data input/output line 14 to the data input/output buffer 13. The cell data is thus read out.

Although only one comparator 6 is illustrated, there are actually the same number of comparators 6 as the number of spare memory rows, and each comparator 6 produces a signal when the address buffer output signal is identical to the address programmed by the PROM elements 6' in the particular comparator 6.

Although only one each of the dummy decoder 10 and the word line clock generator 9 is illustrated, there are actually four dummy decoders 10 selected by the address buffer output signal, and four word line clock generators 9 corresponding to the respective dummy decoders 10.

In the above-described semiconductor memory device, a precharge period is required in which the comparator is initialized before comparing the input address with the programmed address. During this precharge period, the address buffer output signal input to the comparator 6 must be kept low. and after the precharge period, the address buffer output is activated whereupon the comparator 6 operates to carry out the comparison. In a semiconductor memory device with a redundancy configuration for row addresses, the precharge can be implemented in synchronism with a strobe signal such as $\overline{RAS}$ before the row address is determined. However, in a static column mode, the address of the memory cell which are read out is chanwed responsive to the change in the address signal, once a row has been selected by a $\overline{RAS}$ signal. In such a static column mode, the address buffer output must be made low after change of the external input address, and the precharge must be made, before the address buffer output is activated to cause the comparator operation. Thus with the conventional redundancy configuration with the comparator requiring a precharge period before activation of the address buffer output, it is difficult to reduce the time (access time) from the change in the column address in the static column mode to the read-out of the data.

SUMMARY OF THE INVENTION

An object of the invention is to reduce the access time in a static column mode in a semiconductor memory device with a redundancy configuration.

A semiconductor memory device according to the invention is of a redundancy configuration having lines of main memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line, in substitution for the defective line said semiconductor memory device comprising:

a comparator comparing an address input to the memory device, with an address of the defective line which has been programmed in it, a spare line selector responsive to the output of the comparator for selecting the spare line when the input address is found to coincide with the programmed address, a line decoder responsive to the input address for selecting one of the lines of the normal memory cells, and means responsive to the output of the comparator for producing a signal for inactivating the line decoder when the input address is found to coincide with the address of the defective line, wherein said comparator comprises a dynamic NOR gate having discharge paths each wormed of a gate element receiving a bit of the input address or an inversion of said bit to be opened or closed depending on the value of the particular bit of the input address currently applied, and a PROM element in series with the gate element, the PROM elements of the discharge paths being programmed to represent an address of a defective line, the dynamic NOR gate having a first node forming an output thereof and a second node, each of the series connections of the PROM element and the gate element being connected across the first and the second nodes, and equalizing means for causing the potential on the second node to be substantially identical with the potential on the first node during the precharge period.

With the arrangement described above, during precharge of the comparator, the node which is precharge and the node to which the precharged electric charge flows through the PROM element and the gate element are made to have identical potential, so that it is not necessary to inactivate the address buffer during the precharge. This is because no current flows through the nodes even if the address buffer is activated. Accordingly it is possible to establish the address buffer output during the precharge period, and cause the comparator to operate immediately after the precharge period. Thus the access time in the static column mode can be reduced.

DETAILED DESCRIPTION OF THE PREFERRED EMBODIMENTS

Figure 1:
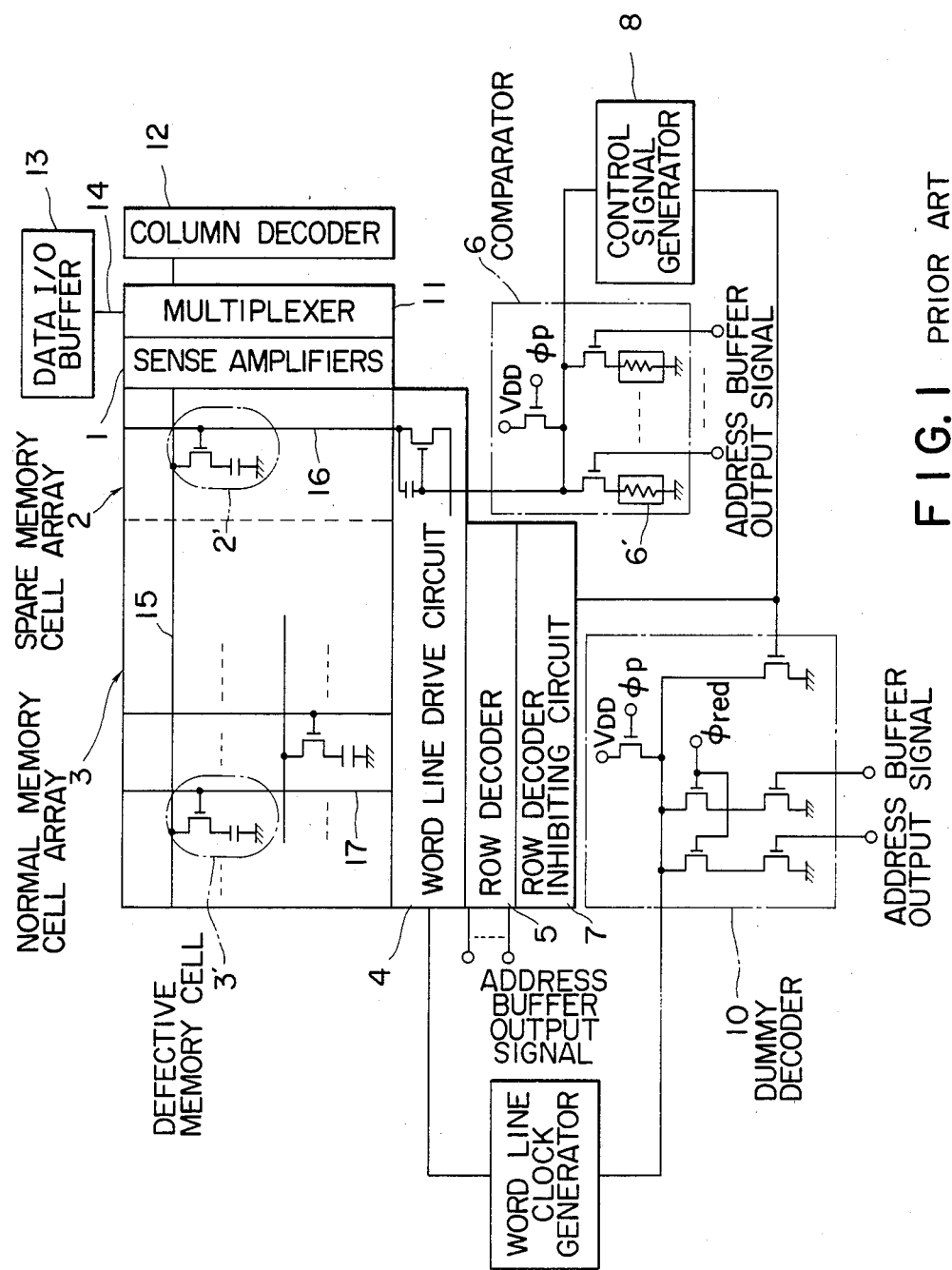
FIG. 1 is a schematic view showing a conventional semiconductor memory device.

An embodiment of the invention will be described with reference to FIG. 2. In the embodiment illustrated in FIG. 2, it is assumed that there are provided four columns of spare memory cells. But the invention is applicable to a memory device having any other number of spare columns. The invention is also applicable to a memory device having spare rows, as described in connection with FIG. 1.

Figure 2:
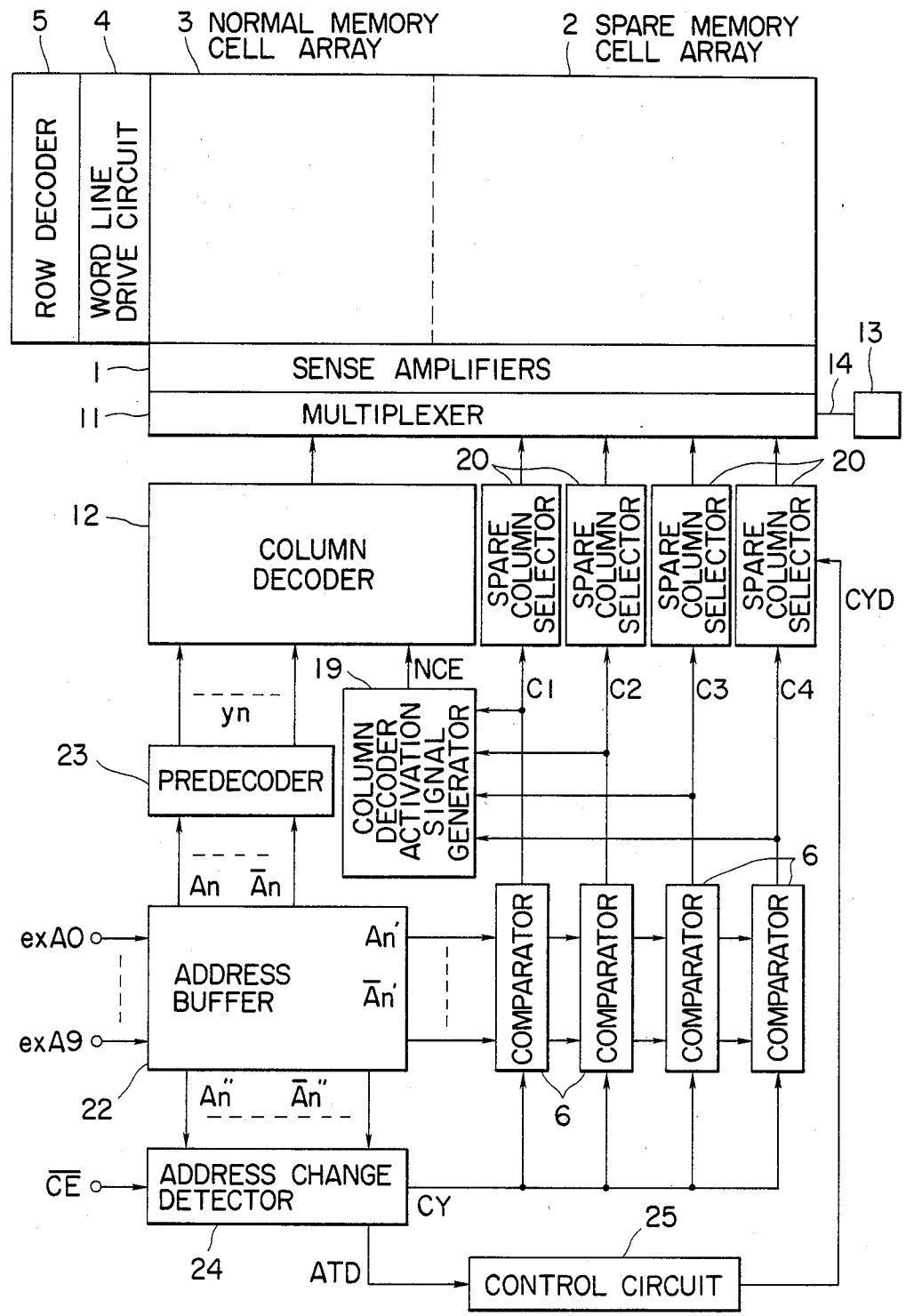
FIG. 2 is a schematic view showing a semiconductor memory device of an embodiment of the invention.

The memory device shown in FIG. 2 comprises a row 1 of sense amplifiers, an array 2 of spare memory cells, an array 3 of normal memory cells, a word line drive circuit 4, a row decoder 5, a multiplexer 11, a data input/output buffer 13, a data input/output line 14 and a column decoder 12. The memory device further comprises four comparators 6 provided in association with the four spare columns. Each comparator compares the input address with an address of a column containing a defective memory cell Which has been programmed in it, and a column decoder activation signal generator 19, which is in the form of a NOR gate receiving an outputs C1 to C4 of the four comparators 6. When the output NCE to the column decoder activation signal generator 19 is low, the column decoder 12 is not activated so that none of the columns of the normal memory cells are selected. The memory device further comprises four spare column selectors 20 provided in association with the four spare columns. Each of the spare column selectors 20 comprises an AND gate receiving the output signal Ci (i=1, 2, 3 or 4) of the corresponding comparator 6 and a signal CYD to be described later.

The memory cell further comprises an address buffer 22. a predecoder 23, an address change detector 24 for detecting change in the address, and a control circuit 28. $\overline{CE}$ denotes a signal which goes low after termination of sense operation. ATD denotes an output signal of the address change detector 24 which goes high when the signal $\overline{CE}$ is high or when the address changes. CY denotes a signal which is a complement of the signal ATD. The signal CY is therefore made low for a predetermined time at the time of sense amplification or the change in the column address, thereby to initialize the comparator. CYD denotes a signal which goes high a predetermined delay time after the signal CY. yn denotes a predecode signal. exA0 to exA9 denote external input address signals. An, $\overline{An}$ denote address buffer output signals for driving decoder 12. An', $\overline{An'}$ denote address buffer output signals for driving the comparator 6. An", $\overline{An''}$ denote address buffer output signals for driving the address change detector 24. The signals An", $\overline{An''}$ have smaller delay time from the external input stage than the signals An', $\overline{An'}$, which in turn have smaller delay time from the external input stage than the signals An $\overline{An}$. This can be implemented by having the signals An", $\overline{An''}$, An', $\overline{An'}$ derived from intermediate stages of the address buffer, with the signals An", $\overline{An''}$ derived from an earlier stages than the signals An', $\overline{An'}$.

Figure 3:
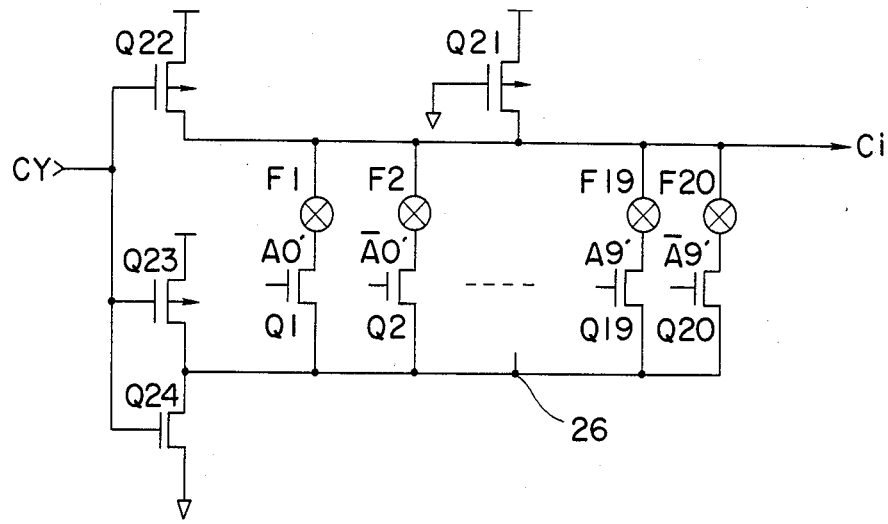
FIG. 3 is a circuit diagram showing an example of a comparator.

FIG. 3 shows an example of the comparator 6 for comparing input address with the address of the defective memory cell. It comprises PROM elements F1 to F20, which are selectively blown or unblown so that the set of the PROM elements represent or codify the address of the defective memory cell for which the corresponding spare memory cell should be substituted. When the spare column for which the comparator is provided is not used to substitute any normal memory cell, all the PROM elements are left unblown. The comparator 6 further comprises n-channel MOSFETs Q1 to Q20 and Q24 and p-channel MOSFETs Q21 to Q33. Thus, the comparator 6 of the illustrated example comprises a dynamic NOR gate comprising gate elements in the form of transistors for inputting address signals An', $\overline{An'}$ and PROM elements in the form of fuse elements connected in series with the gate elements. The transistors Q1 to Q20 receive at their gate electrodes the respective bits of the address signal An' and its complement $\overline{An'}$. Each of the series connections of the gate element and the PROM element forms a discharge path of the dynamic NOR gate and is connected across the node Ci forming the output of the comparator and a second node. The transistor Q22 and Q23 serves to couple, when made conductive, the node Ci and the node 26 to a power supply V. The transistor Q24 serves to discharge, when made conductive, the node 26.

Figure 4:
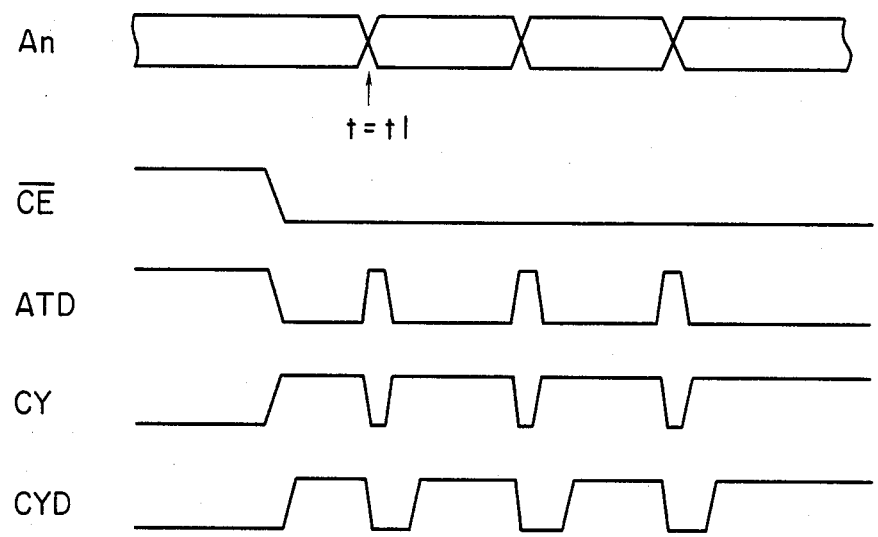
FIG. 4 is a time chart showing various signals in the comparator of FIG. 3.

The operation of the comparator will be described with reference to FIG. 4. When there occurs a change in the column address at time t=t1 during a preparatory period of the column decoder, the output signal ATD of the address change detector 24 is made high for a predetermined time period and the signal CY is made low for a predetermined time period. The transistors Q22, Q23 are then conductive while the transistor Q24 is nonconductive. The output node Ci of the comparator 6, i.e., the node to be precharged, and the node 26 are precharged through the transistors Q22 and Q23, respectively, to a high potential Vcc. The two nodes Ci and 26 are made to have the same potential. Irrespective of the input signals to the transistors Q1 to Q20, the output Ci is kept high, so that the address buffer can be operated to supply the input address signal to the comparator, in parallel with the precharge.

When the signal CY goes high, the transistor Q24 conducts. If the input address does not coincide with the address of the defective memory cell preprogrammed on the set of PROM elements, at least one transistor in series with an unblown PROM element conducts, so that the output Ci is discharged through the series connection of the unblown PROM element and the conducting transistor to go low. When the input address coincides with the programmed address all the transistors in series with the unblown PROM elements are nonconductive, so that the output Ci is kept high.

When all the PROM elements are left unblown (because the corresponding spare column is not used for the substitution) the output Ci goes low so that the result is identical to the situation where there is no coincidence.

Thus, the comparison of the input address with the programmed address is carried out after the signal CY goes high. In the comparator of the illustrated example, the levels of the input address signals are established, during the precharge period when the signal CY is low,.i. e., before the signal CY goes high. As a result, the comparison can be initiated immediately after the precharge. The output Ci of the comparator is input to the corresponding spare column selector 20 and the column decoder activation signal generator 19.

The column decoder activation signal generator comprises a NOR gate receiving the four output signals C1 to C4 from the four comparators 6. When an address of a defective column is input, the output Ci (i=1,2,3 or 4) of one of the four comparators 6 is kept high so that the column decoder activation signal NCE is kept low. The result is that the column decoder is not operated and the normal memory cells are not selected.

When the input address does not coincides with any of the preprogrammed address, the signal C1 to C4 all go low at the time of the signal CY going high, so that the column decoder activation signal NCE goes high. The result is that the column decoder is operated and the normal memory cells are selected.

Each of the spare column selectors 20 comprises, as described, an AND gate receiving the comparator output Ci and the signal CYD, which goes high a predetermined time after the signal CY, that is when the level of the column decoder activation signal NCE has been established following the signal CY going high and operation of the comparator. When the output of a spare column selector 20 is high, the corresponding spare column is selected.

Thus, according to the embodiment described above, the nodes Ci and the node 26 are made to have the same potential during the precharge period of the comparator. With such an arrangement, no current flows between the two nodes even if an input address is applied. It is therefore unnecessary to inactivate the address signal during the precharge period, as opposed to the conventional arrangement, and it is possible to have the comparison take place immediately after the precharge.

The description has been made with reference to a memory having spare columns. The invention is also applicable to a memory having spare rows. The term "line" in the appended claims should be construed to mean "row" as well as "column".

The description has been made with reference to a redundancy configuration of a dynamic RAM having a static column mode. The invention is also applicable to a redundancy configuration of rows or columns of static RAMs.

The invention has been described with reference to a type of memory that has a (column) decoder activation signal generator 19 which supplies a signal NCE of "H" level except when any of the comparators 6 produces a signal Ci. But the invention is also applicable to the type of memory having a (row) decoder inhibiting circuit 7 which serves io inactivate the row decoder 5.

As has been described, according to the semiconductor memory device of the invention, the node of the comparator to be precharge and the node to which the precharged electric charge on the above-mentioned node flows through the PROM element and a gate element are made to have the same potential. As a result, the address buffer can be operated to supply an address signal to the comparator, during the precharge period. Accordingly, comparison at the comparator can be carried out immediately after the precharge period. In the conventional arrangement, it was necessary to cause the address buffer to operate after the precharge period, and then to have the comparison take place. The access time in the static column mode can therefore be reduced.

What is claimed is:

1. A semiconductor memory device of a redundancy configuration having lines of normal memory cells each storing data of one bit and a line of spare memory cells each storing data of one bit, the spare line being formed to substitute a defective line containing a defective main memory cell if there is such a defective line, the substitution by the spare line being achieved by having an arrangement by which the spare line is selected by the address of the defective line, in substitution for the defective line, said semiconductor memory device comprising:
   a comparator comparing an address input to the memory device, with an address of the defective line which has been programmed in it,
   a spare line selector responsive to the output of the comparator for selecting the spare line when the input address is found to coincide with the programmed address,
   a line decoder responsive to the input address for selecting one of the lines of the normal memory cells, and
   means responsive to the output of the comparator for producing a signal for inactivating the line decoder when the input address is found to coincide with the address of the defective line, wherein said comparator comprises a dynamic NOR gate having discharge paths each formed of a gate element receiving a bit of the input address or an inversion of said bit to be opened or closed depending on the value of the particular bit of the input address currently applied, and a PROM element in series with the gate element, the PROM elements of the discharge paths being programmed to represent an address of a defective line, the dynamic NOR gate having a first node forming an output thereof and a second node, each of the series connections of the PROM element and the gate element being connected across the first and the second nodes, and equalizing means for causing the potential on the second node to be substantially identical with the potential on the first node during a precharge period.

2. A device according to claim 1, further comprising an address buffer providing a first and a second address signal representing the input address and its complement, wherein the gate element of each discharge path is provided to receive respective one of the bits of the first and the second address signals.

3. A device according to claim 1, wherein the gate element of each discharge path comprises a transistor having a gate electrode connected to receive a bit of the input address or its complement.

4. A device according to claim 1, wherein said comparator further comprises means for precharging the first node during the precharge period.

5. A device according to claim 4, wherein said precharging means comprises a transistor coupling the first node to a power supply and being made conductive during the precharge period.

6. A device according to claim 6, wherein said equalizing means comprises an additional transistor coupling the second node to the power supply during the precharge period.

7. A device according to claim 1, wherein each of the PROM elements comprises a fuse which has been blown or unblown depending on the corresponding bit.

8. A semiconductor memory device of a redundancy configuration having lines of normal memory cells each storing data of one bit and spare lines of spare memory cells each storing data of one bit, each of the spare lines being formed to substitute a defective line containing a defective memory cell if there is such a defective line, the substitution of each spare line being achieved by having an arrangement by which the spare line is selected by the address of the corresponding defective line, in substitution for the defective line, comparators provided in association with respective spare lines, each comparator comparing an address input to the memory device, with the address of the corresponding defective line which has been programmed in the comparator, spare line selectors provided in association with respective comparators, each spare line selector being responsive to the output of the associated comparator for selecting the corresponding spare line when the input address is found to coincide with the programmed address in the corresponding comparator, a line decoder responsive to the input address for selecting one of the lines of the normal memory cells, and means responsive to the outputs of the comparators for producing a signal for inactivating the line decoder when the input address is found to coincide with any of the programmed addresses, wherein each of the comparator comprises a dynamic NOR gate having discharge paths each formed of a gate element recieving a bit of the input address or an inversion of said bit to be opened or closed depending on the value of the particular bit of the input address currently applied, and a PROM element in series with the gate element, the PROM elements of the discharge paths of each compatator being programmed to represent an address of a defective line, the dynamic NOR gate having a first node forming an output thereof and a second node, each of the series connections of the PROM element and the gate element being connected across the first and the second nodes, and equalizing means for causing the potential on the second node to be substantially identical with the potential on the first node during a precharge period.

9. A device according to claim 8, further comprising an address buffer providing a first and a second address signal representing the input address and its complement, wherein the gate element of each discharge path is provided to receive respective one of the bits of the first and the second address signals.

10. A device according to claim 8, wherein the gate element of each discharge path comprises a transistor having a gate electrode connected to receive a bit of the input address or its complement.

11. A device according to claim 8, wherein each of said comparators further comprises means for precharging the first node during the precharge period.

12. A device according to claim 11, wherein said precharging means comprises a transistor coupling the first node to a power supply and being made conductive . during the precharge period.

13. A device according to claim 12, wherein said equalizing means comprises an additional transistor coupling the second node to the power supply during the precharge period.

14. A device according to claim 8, wherein each of the PROM elements comprises a fuse which has been blown or unblown depending on the corresponding bit.

* * * * *